United States Patent [19]

Lorenz et al.

[11] Patent Number: 4,864,106
[45] Date of Patent: Sep. 5, 1989

[54] ELECTRICAL COMPONENT

[75] Inventors: Josef Lorenz; Robert Kicherer, both of Oberderdingen; Ewald Keller, Zaberfeld, all of Fed. Rep. of Germany

[73] Assignee: E.G.O. Elektro-Gerate Blanc u. Fischer, Fed. Rep. of Germany

[21] Appl. No.: 71,197

[22] Filed: Jul. 8, 1987

[30] Foreign Application Priority Data

Jul. 24, 1986 [DE] Fed. Rep. of Germany ....... 3625087

[51] Int. Cl.⁴ .............................................. H05B 3/16
[52] U.S. Cl. .................................. 219/543; 219/546; 219/553; 338/306
[58] Field of Search .............. 219/543, 548, 213, 553, 219/345, 546; 338/306-314; 428/650, 654; 29/611, 620

[56] References Cited

U.S. PATENT DOCUMENTS 3,721,800 3/1973 Eisler .................................. 219/513

FOREIGN PATENT DOCUMENTS

| 0048406 | 9/1981 | European Pat. Off. |
| 708273 | 7/1941 | Fed. Rep. of Germany |
| 1146991 | 10/1963 | Fed. Rep. of Germany |
| 1968229 | 9/1967 | Fed. Rep. of Germany |
| 1440971 | 1/1969 | Fed. Rep. of Germany |
| 1801732 | 5/1969 | Fed. Rep. of Germany |
| 7206250 | 6/1972 | Fed. Rep. of Germany |
| 1515080 | 8/1972 | Fed. Rep. of Germany |
| 7237312 | 4/1977 | Fed. Rep. of Germany |
| 2650466 | 5/1977 | Fed. Rep. of Germany |
| 3200901 | 9/1982 | Fed. Rep. of Germany |
| 8408990 | 7/1984 | Fed. Rep. of Germany |
| 3426804 | 1/1986 | Fed. Rep. of Germany |
| 3501372 | 7/1986 | Fed. Rep. of Germany |

OTHER PUBLICATIONS

De-2: Kobale Manfred, Glas als Substrat in: NTZ, H.10, 1970, S. 528–532.
IBM Technical Disclosure Bulletin, vol. 25, No. 2, Jul. 1982 "Laminated Metal Core Circuit Cord with Controller Thermal Expansivity".

Primary Examiner—E. A. Goldberg
Assistant Examiner—M. M. Lateef
Attorney, Agent, or Firm—Steele, Gould & Fried

[57] ABSTRACT

An electrical component (11) comprises a support (12) largely made from unalloyed steel sheet (13) with an aluminum coating (14). This serves as the anchoring coating for a glass, fused or fired insulating layer (15) applied to the conductor (16). The component is suitable as a self-supporting, heat-emitting room heating resistance element, as well as an electronic support and slide-in element.

26 Claims, 3 Drawing Sheets

U.S. Patent    Sep. 5, 1989    Sheet 2 of 3    4,864,106
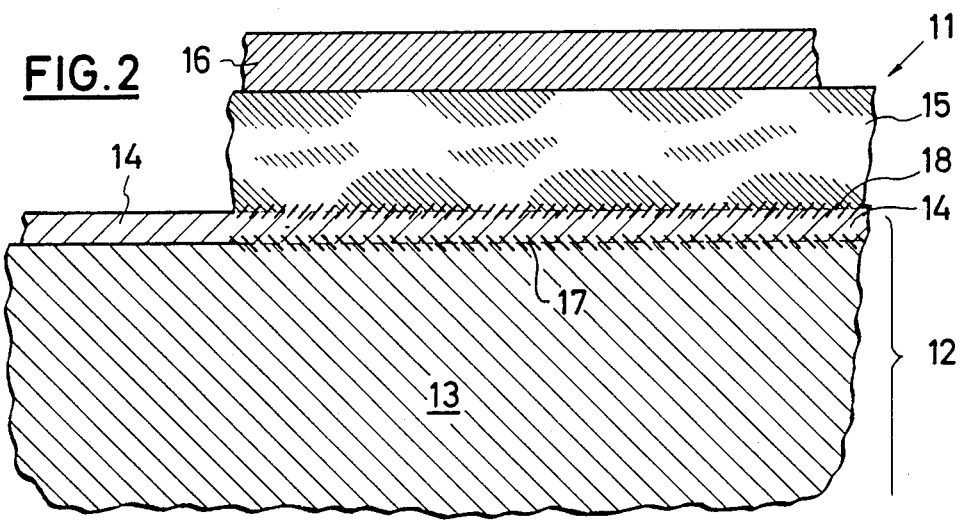
FIG. 2
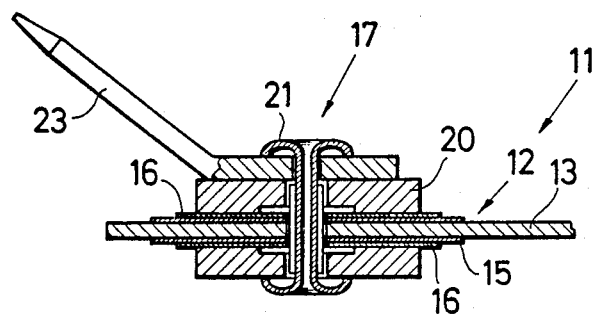
FIG. 3
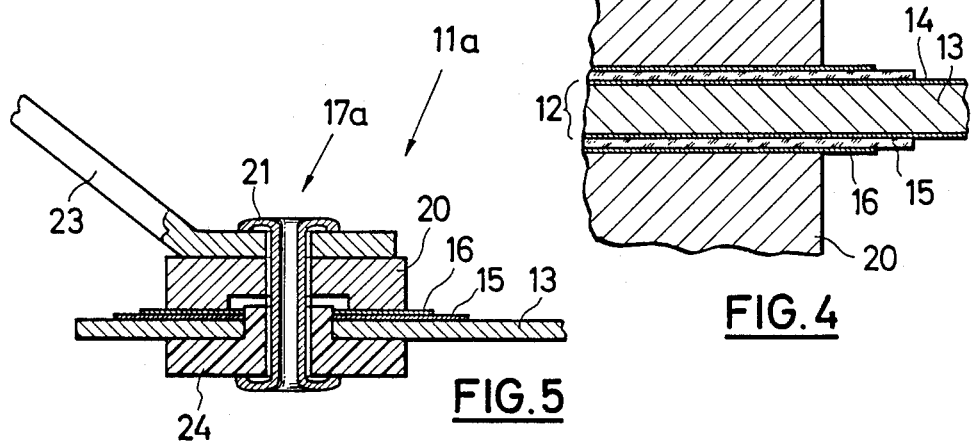
FIG. 4
FIG. 5

ELECTRICAL COMPONENT

BACKGROUND OF THE INVENTION

The invention relates to an electrical component and preferably an electrical component having support means made from mainly iron-containing material, an electrical insulating layer and electric conductor means applied flat to said insulating layer, at least the insulating layer being fused or fired on the support. The invention further relates to a process for the production thereof to a component provided with thick-film resistors for heating purposes or the like.

So-called thick-film resistors or printed circuits normally have an insulating material support, e.g. based on aluminium oxide. It has also already been proposed to produce such components with supports made from metals or metal alloys. In one case, use was made of high-alloyed steels, e.g. stainless steel, which was provided with an insulating enamel coating, to which the printed circuit was applied. However, high-alloyed steels are not only very expensive, but also have a relatively low thermal conductivity. In addition, alkali constituents can diffuse from the enamel coating into the conductors and resistors located thereon, which is unacceptable in most fields of application.

SUMMARY OF THE INVENTION

An object of the present invention is to provide an electrical component and a method for the production thereof, which can be easily manufactured from inexpensive materials and which ensures a good hold of the conductors on the support, accompanied by good functional characteristics and a wide variety of uses.

The invention proposes an electrical component having support means made from mainly iron-containing material, an electrical insulating layer and electric conductor means applied flat to said insulating layer, at least the insulating layer being fused or fired on the support, the support means comprising a base material of iron or steel and a surface layer of aluminium situated between the base material and insulating layer.

The aluminium surface layer provided between the insulating layer and the base material of the support provides the possibility of firmly anchoring the insulating layer to a support made from e.g. unalloyed or low-alloyed steel, e.g. conventional rolled sheet steel, although the burning or baking temperatures for the application of the layers do not allow aluminium. However, the aluminium forms an intermetallic compound or phase with the steel of the support, which not only ensures a good hold, but also gives corrosion protection to parts of the support which may not be covered with the insulating layer. An anchoring zone for the insulating layer is formed in the outer region of the surface layer, i.e. in the boundary zone between the aluminium layer and the insulating layer and which is preferably an alkali-free, glass-based layer. The aluminium layer ensures a much higher thermal conductivity of the support than that of e.g. high-alloyed steel and also compared with the support base material. Thus, in an ideal manner, this support combines the rigidity of steel and the high thermal conductivity, corrosion resistance and excellent adhesive action to glass of aluminium.

The electrical component can be universally used. It can be used with particular advantage as a heating resistor, it having ideal radiation and convection heat transfer characteristics as a result of the relatively thin electrical insulating layer between the conductor and the support, as well as the large surface area of the said support and its good heat distribution. The component can be used directly as a slide-in module and also as a supporting component in space or room heaters. The component is also advantageous for other heating purposes, e.g. for the heating of baking ovens, in which the component could form a muffle wall with outer and/or inner heating resistors. The component could also be advantageously used with heating resistors located on the underside for the heating of hotplates or heating plates made from iron or steel. However, it can also be used for other electrical and electronic purposes. Thus, the conductors can in part form conducting strands and in part resistors and may optionally also contain solder layers or metallizations, permitting the electrical and mechanical connection of other components, e.g. chips, to the support. Ideal conditions are once again ensured by the inexpensive, good heat-dissipating material.

The invention further proposes a method for which manufacturing permits a simple manufacture in the printing process, preferably screen printing. Preferably the support is constituted by a commercially available rolled sheet steel. However, it would also be possible to use other components, e.g. supporting components for appliances, as supports for the conductors. Through the baking or burning of the layers a heat treatment of the support material is simultaneously brought about leading to the tempering thereof.

Further advantages and features of the invention can be gathered from the subclaims, description and drawings and the features can be realized individually or in combination in advantageous versions of the invention. Embodiments of the invention are described hereinafter relative to the drawings.

BRIEF DESCRIPTION OF THE DRAWINGS

FIG. 2 is a greatly enlarged partial section through the component.

FIG. 3 shows a connecting region of a double-sided-coated component.

FIG. 4 is a larger-scale detail from FIG. 3.

FIG. 5 shows a connection from a one-sided-coated component.

DETAILED DESCRIPTION

Figure 1:
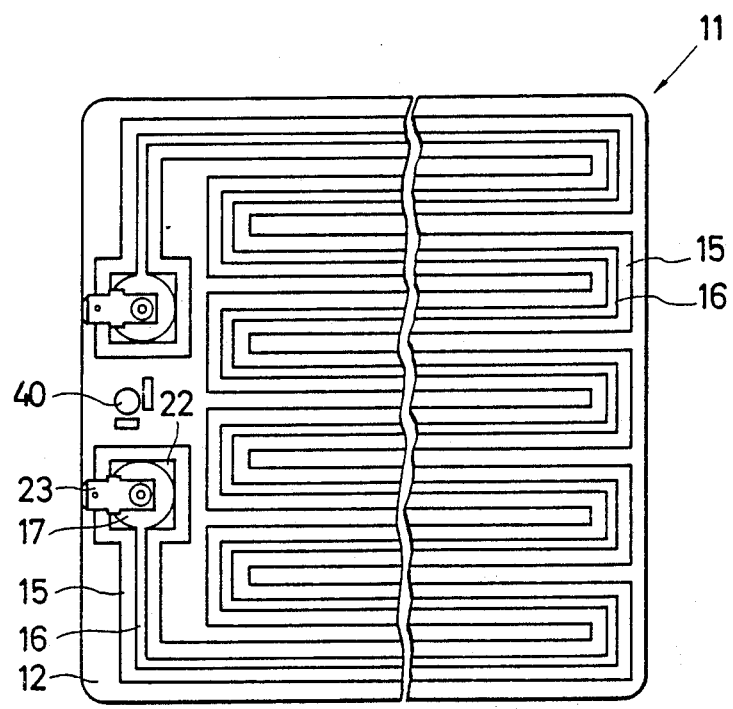
FIG. 1 is a plan view of an electrical component.

The electrical component 11 shown in FIGS. 1 to 4 has a support 12, which is made from aluminized sheet steel of commercially available low-alloyed or unalloyed quality. The aluminization can be constituted by aluminium plating or hot-dip aluminizing. Such steel sheets are e.g. marketed by Thyssen AG, D-4100 Duisburg 11 under the name "fal". Preferably to either side of the basic steel sheet 13 is applied an aluminium surface layer 14, which is preferably between 5 and 80 μm thick and preferably between 15 and 40 μm thick. In areas which are to subsequently carry conductors 16, an insulating layer 15 is applied to support 12, namely to both sides thereof, whereby the areas must not overlap. Conductors 16 and therefore also the insulating layer 15 runs in substantially meander-like manner between two connections 17 substantially uniformly covering the surface of support 12. The insulating layer is wider than the conductors and a gap is left between the insulating layers. This obviates possible tension cracks in the insulating layer and ensures that as much as possible of the good heat emitting metal surface remains free.

In applications where no tension cracks occur in the insulating layer 15, the latter can also be closed.

In the case of the component 11 shown in FIG. 1, it is a space or room heater, which e.g. provides a heating capacity of 200 to 500 Watts to a surface of approximately 300 cm$^2$. Through a corresponding choice of the material for the conductors 16 constructed as a thick-film resistor, e.g. nickel, it can have a considerable PTC effect and in the case of an initial capacity of approximately 500 Watts can automatically lower this during heating to 250 to 300 Watts.

FIG. 2 better shows the layer structure of the component. The aluminium surface layer 14 of the uncoated support (left in FIG. 2) is so converted by heat treatment, e.g. during the firing of the insulating coating 15 and conductor 16 that it forms an intermetallic phase zone 17 between Al and Fe in its area adjacent to base material 13, while a boundary zone 18 is formed towards the outside of surface layer 14 containing an aluminium oxide ($Al_2O_3$) enrichment. The insulating layer 15, which mainly consists of glass, is applied thereto. The thickness thereof is dependent on the insulating characteristics required of it and is generally more than 20 μm and preferably approximately 50 μm. On said insulating layer 15 is located the conductor 16 which, like the glass layer, is produced as a fused or fired layer and, apart from metallic components, e.g. nickel, also contains glass for binding purposes.

The conductor coating thickness is dependent on the required electrical characteristics and can e.g. be approximately 20 μm. The thickness of the basic metal sheet forming support 12 is preferably between 0.5 and 1.5 mm and in special cases above or below this.

FIG. 3 shows the connection 17 of the support 11 provided on both sides with conductor 16. Two cup-shaped connecting pieces 20 made from conductive material are pressed by means of a central rivet 21 (or a corresponding screw) on widened regions 22 of conductor 16. The rivet passes through a hole in the support and can be insulated on its outside. On a connecting piece 20, the rivet also presses on a connecting lug 23, which is obliquely bent and forms a plug connection for a current lead.

FIG. 4 shows a somewhat enlarged representation of part of the connection 17 and support 11 more realistically representing the conditions or ratios of the layer thicknesses. FIG. 5 shows a connection 17a of a support 11a coated on one side. Apart from keeping the metallic connecting piece 20 on the uncoated back surface, central rivet 21 presses on an annular insulating piece 24. Otherwise the connection is like that of FIGS. 3 and 4. Due to the good heat distribution in support 11 a support coated on one side only is sufficient for airconditioners. The two-sided coating, however, provides the possibility of switching in two stages. However, in this case both sides should have at least one connection, which is insulated from the other side, which can be brought about by two correspondingly displaced connections as shown in FIG. 5. In addition, random connection types are possible, e.g. connections soldered or otherwise pressed or shaped directly onto the conductor.

Figure 6:
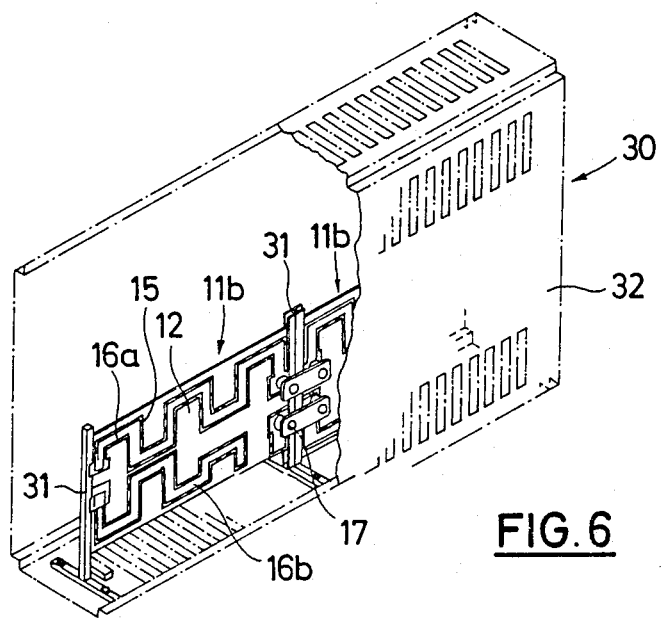
FIG. 6 shows a space heater containing electrical components.

FIG. 6 shows an electric heater 30 for room or space heating purposes and which contains several electrical components 11b. On a support 12, they contain in each case two conductors 16a, 16b applied to one side and running in meandering manner from one narrow side to the other and which also permit a two-stage switching. The narrow sides, in the vicinity of which the connections 17 are also provided, are inserted in U-rails 31 on electric heater 30, which has a casing 32 broken away for convection heating purposes. However, it would also be possible to use the components 11 directly as wall panels for room heating purposes and then e.g. an additional insulating layer can be provided over the conductor 16. The components always have the advantage that they permit a very large-area and uniform heating, operating with low peak temperatures, so that there is no "dust burning" at higher temperatures, which has a negative influence on the airconditioning. To compensate the differing heat emission to the air rising by convection, the density of the heating conductor occupancy on the supports can be varied by modifying the spacing between the conductors so that there are ideal transfer or transmission conditions at all points.

Figure 7:
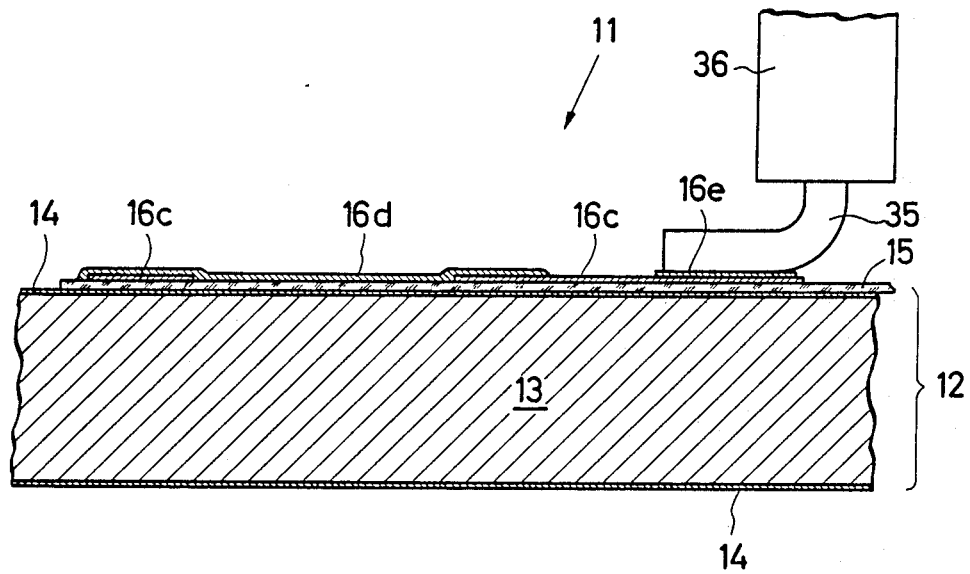
FIG. 7 is a diagrammatic partial section of a member equipped with electrical components.

FIG. 7 is a detail section through a component 11c, which is constructed in accordance with FIG. 2 with regards to the support material 13, aluminium layer 14 and glass layer 15. However, it is not a room heating element, but a support for electronic purposes. Therefore the insulating layer 15 carries conductors 16c made from a good conducting material, whilst there are also resistance layers 16d partly covering them. These resistance layers interconnect two conductors 16c and thereby form a function resistor for an electric or electronic circuit. With the aid of two electrodes 16c and a dielectric 16f a capacitor can be formed, together with other standard passive components, such as e.g. a not shown induction coil. At another point additional solder layers 16e are applied to a conductor 16c of a good conducting type, permitting the soldering of electrical or electronic components, such as e.g. chips, integrated circuits or capacitors, e.g. in SMD technology.

The process for the production of a component according to the invention functions as follows. A glass powder paste is applied to a commercially available, unalloyed or low-alloyed sheet steel with an aluminium surface layer by screen printing and then through the addition of subsequently evaporating liquids and binders, it is made screen printable. The desired surface pattern, e.g. that according to FIGS. 1 or 6 is applied. The paste is dried at ambient temperature and then at somewhat elevated temperature of e.g. 130° C., followed by fusing or firing at 500° to 700° C. It is advantageous to use a total firing or baking time of approximately 50 minutes, whereof approximately 10 minutes is at maximum temperature. When correspondingly higher demands are made on the dielectric strength and a correspondingly greater thickness of insulating layer 15, application can successively take place to several layers in this way. This is followed by screen process printing application of a conductor paste to the insulating layer 15 in accordance with the desired conductor pattern. The conductor paste contains extremely finely divided metal powder, e.g. nickel, as well as in certain circumstances a glass percentage as the binder, together with organic or other evaporating solvents and organic binders, which evaporate on baking in order to bring about screen printability. Drying and baking can take place in the manner described hereinbefore for the insulating layer.

For functional components, as described in FIG. 7, e.g. in the case of conductors based on silver-palladium, it is possible to apply and optionally fire additional resistors made from correspondingly lower conducting material, as well as a solder paste in the same way. The components are then provided with corresponding electrical assemblies or subassemblies 26 and these are completely soldered in the oven. This leads to the advantages of good heat dissipation, an excellent magnetic shielding and optimum mechanical characteristics. If temperature-sensitive components are used for the circuit, it is also possible to selectively heat the soldered joints, which also applies for repair purposes. All the components according to the invention can easily be mechanically worked by random working processes and simultaneously grounding the base part, for which purpose an grounding terminal 40 (FIG. 1) can be provided.

The dielectric glass-based paste used as a basis for the glass can e.g. be a paste of series TCG marketed by Ferro Corporation, Santa Barbara, Calif., USA, department TFS. In the case of baking under the given conditions, it gives an alkali-free, substantially non-porous and non-crystalline layer, which adheres extremely well to the aluminium surface layer of the support and forms a good adhering substrate for the conductor coating. It has been found that the adhesion is so good that although the use of force led to a detachment of the layers within a metal coating or at the steel-aluminium boundary layer 7, this did not occur on the aluminium-dielectric boundary layer 18. The aluminium surface layer forms a corrosion-resistant intermetallic phase with the support by heat action which is stable to well above the melting point of aluminium and this can be brought about during the firing of the layers or beforehand.

Even in the case of one-sided coating of the support, the aluminium surface layer can be applied to both sides to improve the corrosion resistance. The support has the particular advantage that it can be worked very easily using conventional tools.

We claim:
1. An electrical component, comprising:
   support means made from steel, the steel being at most low-alloyed, the support means having a surface layer consisting of aluminum and a metallic alloy of said steel and said aluminum,
   a glass-based electrical insulating layer, the insulating layer being melted directly on an outer surface of the aluminum, the aluminum being otherwise uncoated, and
   an electric conductor means applied flat to said insulating layer.
2. Electrical component according to claim 1, wherein the support means is unalloyed steel.
3. Electrical component according to claim 1, wherein the support means is low-alloyed steel.
4. Electrical component according to claim 1, wherein the support means is conventional rolled sheet steel.
5. Electrical component according to claim 1, wherein the support means is an aluminium-plated steel sheet.
6. Electrical component according to claim 1, wherein the support means is a hot-dip aluminized steel sheet.
7. Electrical component according to claim 1, wherein the insulating layer is an alkali-free glass-based layer.
8. Electrical component according to claim 1, further comprising an anchoring zone, the anchoring zone being enriched with aluminum oxide in a boundary region between the aluminum and the insulating layer.
9. Electrical component according to claim 1, wherein the surface layer has a thickness between 5 and 80 $\mu$m (between about 1/5000 and 1/300 inch).
10. Electrical component according to claim 1, wherein the insulating layer has a greater thickness than the surface layer.
11. Electrical component according to claim 1, wherein the insulating layer is positioned below and applied to surface regions of the support means provided with the electrical conductor means and a surrounding area around the electrical conductor means.
12. Electrical component according to claim 1, wherein the electrical conductor means comprise at least a thick-film resistor.
13. Electrical component according to claim 10, wherein the thick-film resistor contains a metal with an increased positive temperature characteristic (PTC) such as nickel.
14. Electrical component according to claim 1, wherein the electrical component is a large-area, plate-like heating element for a room heater.
15. Electrical component according to claim 1, wherein the electrical conductor means are arranged on the support means in a varying density adapted to heat transfer conditions.
16. Electrical component according to claim 1, further comprising a ground terminal connected for grounding the support means.
17. Electrical component according to claim 1, further comprising connection means on contacting zones of the electrical conductor means which are located at openings in the support means.
18. Electrical component according to claim 1, wherein the electrical conductor means at least partly comprise high-conducting, low-resistant material and are connected to conducting means including one of film resistors, thick-film capacitors, inductances and connections of electrical and electronic assemblies with which the component is equipped.
19. An electrical component manufactured by the process of zonally applying to a support made from at most low-alloyed steel having an aluminum surface layer with an uncoated outer surface, a glass-containing pasty insulating material by printing, drying and firing the support, as so prepared, at temperatures in a range between 400 and 800 degrees C. (about 700 to 1400 degrees F.), to produce an insulating layer, thereafter applying pasty conductive layer material to the insulating layer and drying and firing this under said range of temperatures, the component thereby having a support made from at most low-alloyed steel, with a surface layer containing aluminum and a metallic alloy between said steel and said aluminum, a molten glass-based electrical insulating layer, and electric conductor means applied flat to the insulating layer.
20. Method for manufacturing electrical components, comprising the steps of:
   zonally applying to a support made from at most low-alloyed steel having an aluminum surface layer with an uncoated outer surface, a glass-containing, pasty insulating layer material by printing, drying and firing the support, as so prepared, at temperatures in a range between 400° and 800° C. (about 700° to 1400° F.), to produce an insulating layer, thereafter applying pasty conductive layer material to the insulating layer and drying and firing this under said range of temperatures.

21. Method according to claim 20, wherein at least one of the layer materials is applied by printing.

22. Method according to claim 20, wherein the pasty conductor layer material comprises metal powder and a glass proportion.

23. Method according to claim 20, wherein at least the insulating layer material is successively applied in the form of several coatings.

24. Method according to claim 20, wherein following the application of other conductors, as one of the conductor layers, solder regions are applied in layer form and after equipping the component with assemblies there is heating to soldering temperature.

25. Method according to claim 24, wherein said heating is selective.

26. Method according to claim 20, wherein said temperature range is between 500° and 700° C. (about 900° and 1200° F.).

* * * * *